United States Patent
Suzuki

(10) Patent No.: US 6,566,595 B2
(45) Date of Patent: May 20, 2003

(54) SOLAR CELL AND PROCESS OF MANUFACTURING THE SAME

(75) Inventor: Yoshiyuki Suzuki, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/984,194

(22) Filed: Oct. 29, 2001

(65) Prior Publication Data

US 2002/0050288 A1 May 2, 2002

(30) Foreign Application Priority Data

Nov. 1, 2000 (JP) ........................ 2000-334752

(51) Int. Cl.[7] ............... H01L 31/04; H01L 31/0352
(52) U.S. Cl. .................. 136/255; 136/252; 136/262; 136/249; 257/461; 257/431; 257/458; 257/464; 257/465; 438/93; 438/94; 438/57; 438/71
(58) Field of Search ................. 136/255, 252, 136/262, 249; 257/461, 431, 458, 464, 465; 438/93, 94, 57, 71

(56) References Cited

U.S. PATENT DOCUMENTS 6,166,320 A * 12/2000 Nagashima et al. ........ 136/249

6,444,897 B1 * 9/2002 Luque-Lopez et al. ..... 136/255
2002/0017656 A1 * 2/2002 Graetzel et al. ............ 257/184

FOREIGN PATENT DOCUMENTS

| JP | 6-163962 | 6/1994 |
|---|---|---|
| JP | 7-231108 | 8/1995 |
| JP | 9-237908 A | * 9/1997 |

OTHER PUBLICATIONS

K.W.J. Barnham et al.; "A New Approach to High–Efficiency Multi–Band–Gap Solar Cells"; Dec. 8, 1989; pp. 3490–3493; American Institute of Physics.

* cited by examiner

Primary Examiner—Alan Diamond
(74) Attorney, Agent, or Firm—Nixon & Vanderhye P.C.

(57) ABSTRACT

A solar cell having a p-type semiconductor layer and an n-type semiconductor layer made of a first compound semiconductor material, and a semiconductor layer sandwiched between the p-type semiconductor layer and the n-type semiconductor layer. The semiconductor layer includes at least a quantum well layer which is made of a second compound semiconductor material and has a plurality of projections of at least two different sizes.

21 Claims, 9 Drawing Sheets

SOLAR CELL AND PROCESS OF MANUFACTURING THE SAME

CROSS-REFERENCE TO RELATED APPLICATION

This application is related to Japanese application No. 2000-334752 filed on Nov. 1, 2000, whose priority is claimed under 35 USC §119, the disclosure of which is incorporated by reference in its entirety.

BACKGROUND OF THE INVENTION

1. Field of the Invention

The present invention relates to a solar cell having pin structure made of compound semiconductor materials and a process of manufacturing the same.

2. Description of Related Art

Most of recent solar cells utilize Si as a starting material. In view of coordination with a solar beam spectrum, solar cells utilizing GaAs, which is a compound semiconductor material, are also applied practically to, for example, a power source of artificial satellites that requires high photoelectric conversion efficiency.

There is a limit to the photoelectric conversion efficiency of a solar cell made of a single material because it only utilizes light of wavelength corresponding to a forbidden band width derived from the material. Under such circumstances, a solar cell of tandem structure made of several materials having different forbidden band widths is developed for obtaining higher photoelectric conversion efficiency. In the tandem solar cell, multiple solar cells are stacked in decreasing order of the forbidden band width from a light receiving face. Accordingly, light of broad wavelength corresponding to the forbidden band widths of the stacked solar cells is utilized.

Another solar cell of multiple quantum well structure is proposed (Journal of Applied Physics vol. 67 p3490 (1990)). The solar cell comprises an i-type semiconductor layer 103 inserted between a pn junction of an n-type semiconductor layer 2 and a p-type semiconductor layer 4 as shown in FIG. 14. The i-type semiconductor layer 103 includes a barrier layer 130 formed of a semiconductor material for forming the pn junction and a well layer 131 formed of a semiconductor material having a forbidden band width smaller than that of said semiconductor material.

An energy band model of the above-mentioned solar cell of multiple quantum well structure is shown in FIG. 15.

Referring to FIG. 15, Ec and Ev show a lower end of a conduction band and an upper end of a valence band, respectively. With such a structure, not only light corresponding to the forbidden band width of the semiconductor material forming the pn junction but also light corresponding to the forbidden band width of the semiconductor material forming the well layer 131 is utilized for the photoelectric conversion, without reducing an open voltage. Therefore, solar light of longer waveforms contributes to the photoelectric conversion, which allows obtaining a solar cell with improved spectral response characteristics and high output.

Further, Japanese Unexamined Patent Publication Hei 7 (1995)-231108 discloses a solar cell wherein the i-type semiconductor layer in the pin structure is formed such that the forbidden band width thereof is varied stepwise from the p-type region to the n-type region. According to the publication, semiconductor materials of different compound crystal ratios are grown by crystallization by MBE in sequence to produce the forbidden band width varied stepwise.

According to the above-mentioned solar cell of tandem structure, solar cells and tunnel junctions connecting the cells are formed under optimum conditions, which requires an extremely elaborate and complicated manufacturing process. However, a solar cell with high photoelectric conversion efficiency which compensates such a process has not been provided yet.

In the above-mentioned solar cell of multiple quantum well structure, on the other hand, only a light of defined wavelength contributes to carrier excitation because of a quantum level of electrons defined by a thickness of the well layer 131, or the forbidden band width of the material of the well layer 131.

Accordingly, in order to enlarge the wavelength range, a measure of varying the thickness of the well layer stepwise or a measure of varying the ratio of compound crystals in the semiconductor material for forming the well layer must be employed.

For the manufacture of the well layer having a desired thickness and composition ratio by such measures, however, a highly accurate process is also required as the above-mentioned solar cell of tandem structure.

SUMMARY OF THE INVENTION

In view of the above-described problems, the present invention has been achieved to provide a solar cell of high photoelectric conversion efficiency and a simplified process of manufacturing the same.

According to the present invention, provided is a solar cell having a p-type semiconductor layer and an n-type semiconductor layer made of a first compound semiconductor material, wherein one or more quantum well layer which is made of a second compound semiconductor material and has a plurality of projections on its surface is formed between the p-type semiconductor layer and the n-type semiconductor layer, the projections being different in size on a single quantum well layer or on any one of the quantum well layers.

According to another aspect of the present invention, provided is a process of manufacturing a solar cell which comprises a p-type and n-type semiconductor layers of a first compound semiconductor material. The process comprises the steps of: forming a p-type or n-type semiconductor layer on a substrate; forming one or more quantum well layer with a second compound semiconductor material; and forming an n-type or p-type semiconductor layer of the first compound semiconductor material; wherein the quantum well layer is formed by providing a base portion and a plurality of projections on the base portion in sequence, and the projections are formed to have different sizes on a single layer or on any one of the quantum well layers.

That is, a feature of the present invention is to insert the quantum well layer which is made of the second compound semiconductor material and has the projections (hereinafter referred to as a quantum dot layer) in a pn junction region of a solar cell of pn structure or in an i-type semiconductor layer of a solar cell of pin structure.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Embodiments of the present invention will be explained hereinafter with reference to the figures. However, the invention is not limited thereto.

Figure 1:
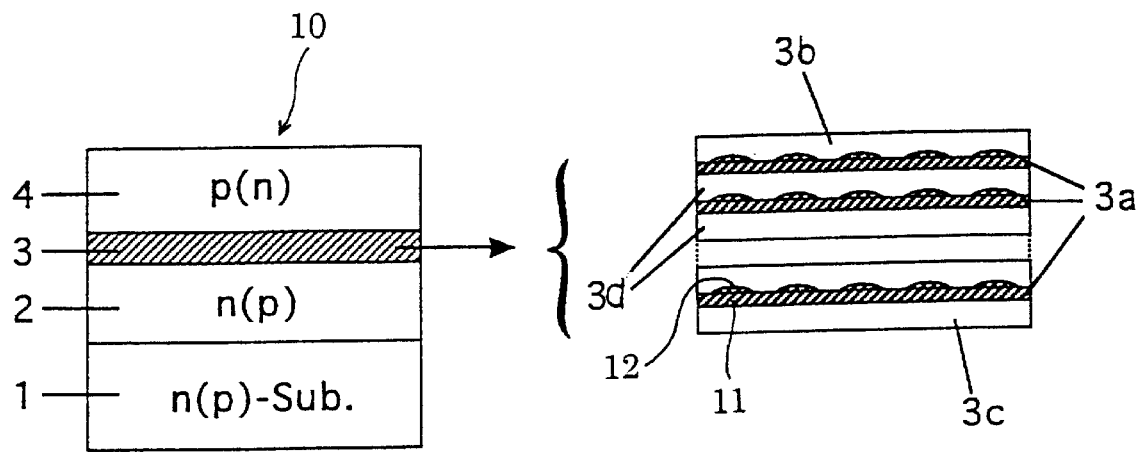
FIG. 1 is a view schematically illustrating a basic structure of a solar cell according to the present invention.

FIG. 1 shows a basic structure of a solar cell of pin structure according to the present invention made of compound semiconductor materials.

A solar cell 10 includes a substrate 1, a p-type or n-type semiconductor layer 2 of a first compound semiconductor material formed on the substrate 1, an i-type semiconductor layer 3 formed on the semiconductor layer 2 and a n-type or p-type semiconductor layer 4 of the first compound semiconductor material formed on the i-type semiconductor layer 3.

The i-type semiconductor layer 3 includes a base layer 3c made of the first compound semiconductor material, a quantum dot layer 3a of a second compound semiconductor material formed on the base layer 3c and a cap layer 3b of the first compound semiconductor material formed on the quantum dot layer 3a. The three layers constitute a unit 30. The cap layer 3b ensures the flatness of the i-type semiconductor layer surface. In a tandem structure including the quantum dot layers 3a and the cap layers 3b being stacked, the cap layer 3b sandwiched between the quantum dot layers 3a serves as an intermediate layer 3d.

The quantum dot layer 3a includes a base portion 11 which serves as a bottom and a plurality of projections 12 (quantum dots) formed on the base portion 11. The projections 12 are different in thickness on the same quantum dot layer 3a or a number of quantum dot layers 3a.

For example, in the tandem structure wherein the i-type semiconductor layer 3 includes a plurality of quantum dot layers 3a, the quantum dot layers 3a are preferably stacked such that the projections 12 different in thickness are formed on a number of quantum dot layers 3a. In this case, the projections 12 may be arranged on the quantum dot layers 3a in increasing order of thickness from a light receiving face (e.g., from a top surface) of the solar cell 10.

Where the i-type semiconductor layer 3 is formed of a single quantum dot layer 3a, the projections 12 different in thickness are scattered over the same base portion 11.

According to the present invention, the substrate is not particularly limited as long as it is generally used as a substrate for the solar cell. Examples thereof include a metallic substrate, a resin substrate and a glass substrate.

The first compound semiconductor material for forming the n-type or p-type semiconductor layer may be a compound of a group III element and a group V element shown in the periodic table, e.g., GaAs, GaAlAs or the like.

The second compound semiconductor material for forming the quantum well layer may be a compound of a group III element and a group V element shown in the periodic table such as InGaAs, GaAs or the like.

According to the present invention, the quantum dot layer 3a is inserted in the i-type semiconductor layer 3. Therefore, in addition to light of wavelength corresponding to the forbidden band width of the semiconductor material for forming the pn junction, light of wavelength corresponding to the practical forbidden band width of the quantum dot layer 3a is also absorbed. Therefore, high photoelectric conversion efficiency is achieved. Further, since the forbidden band width can be varied depending on the combination or compound crystal ratio of compound semiconductor materials used for forming the i-type semiconductor layer 3, a solar cell which allows photoelectric conversion at high efficiency corresponding to the incident light can be manufactured.

Figure 2:
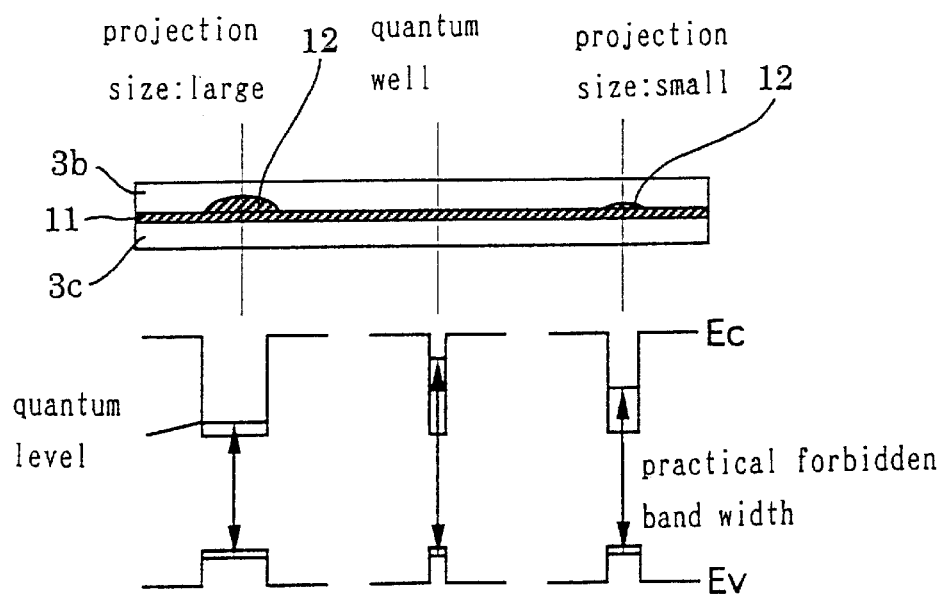
FIG. 2 is a view illustrating a relationship between the sizes of projections on a quantum dot layer shown in FIG. 1 and practical forbidden band widths.

With the thus formed solar cell 10, as shown in FIG. 2, the forbidden band width of the semiconductor material for forming the solar cell is not determined to a constant value but varied within a broad range, which extends the wavelength range in which the photoelectric conversion can be carried out.

That is, the projections 12 different in size are formed on the base portion 11 of a single quantum dot layer 3a or a number of base portions 11 of plural quantum dot layers 3a. Accordingly, quantum wells having energy gaps between quantum levels at the conduction band Ec and the valence band Ev corresponding to the sizes of the projections 12 (i.e., the practical forbidden band widths of different values) are obtained. Such a structure shows characteristics different from common bulk crystals, and electrons (or holes)

enclosed in the crystal structure as miniscule as several tens of nm are given with energy levels of various degrees.

In a process of manufacturing the solar cell according to the present invention, the quantum well layer may be formed by lithography and selective etching, or by self-growing mechanism.

Figure 3:
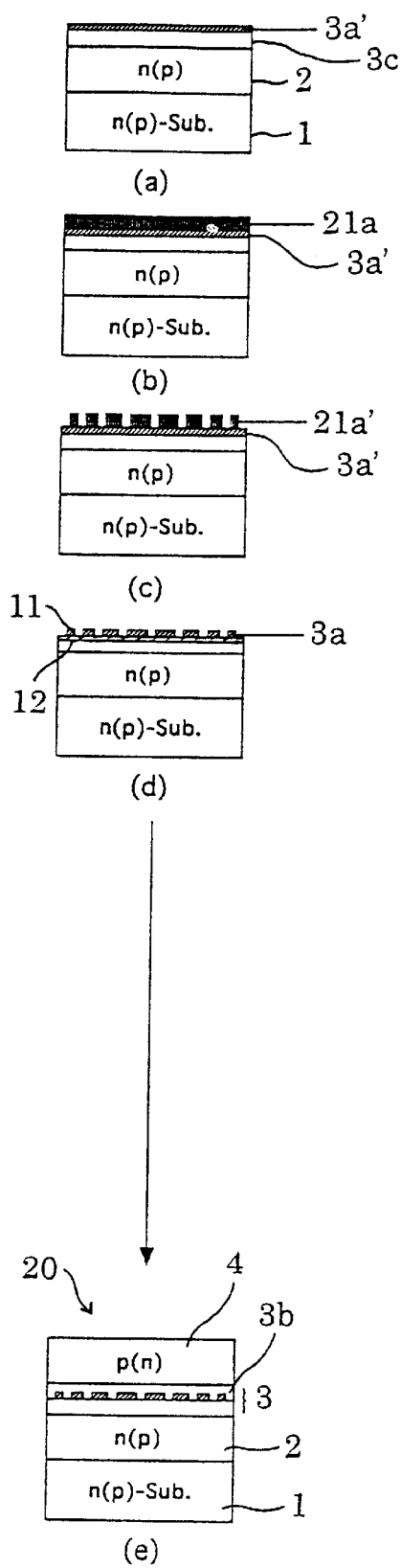
FIGS. 3(a) to 3(e) are views illustrating the steps of photolithography and selective etching for manufacturing a solar cell having a single quantum dot layer.

A process utilizing the lithography and selective etching is described with reference to FIGS. 3 and 4.

FIGS. 3(a) to 3(e) illustrate the steps of manufacturing a solar cell of pin structure having a single layered i-type semiconductor layer 3.

First, an n-type (or p-type) layer 2 made of a first compound semiconductor material is grown by crystallization on an n-type (or p-type) substrate 1, a base layer 3c made of the first compound semiconductor material is grown by crystallization, and then a film 3a' for forming a quantum dot layer 3a is grown by crystallization to have a thickness of 10 nm (FIG. 3(a)). A photoresist 21a is applied (FIG. 3(b)) and then subjected to exposure and development using a resist mask to form a resist pattern 21a' (FIG. 3(c)). With the resist pattern 21a' as a protective film, the film 3a' is selectively etched to form the quantum dot layer 3a (FIG. 3(d)).

The resist pattern 21a' includes traces 21a' of different sizes. By the selective etching using the traces as a mask, projections 12 of different sizes made of crystals of plural kinds are formed on a base portion 11. Thus, the quantum dot layer 3a is completed.

Next, a cap layer 3b is grown by crystallization on the thus formed quantum dot layer 3a and a p-type (or n-type) layer 4 is formed thereon to complete a pin solar cell 20 (FIG. 3(e)).

Figure 4:
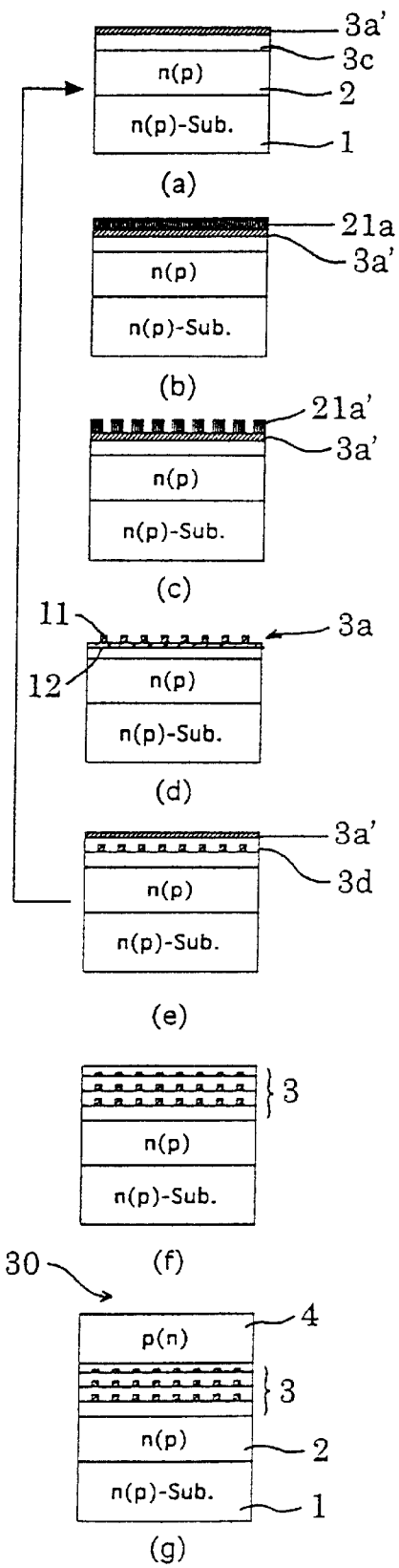
FIGS. 4(a) to 4(g) are views illustrating the steps of photolithography and selective etching for manufacturing a solar cell having stacked quantum dot layers.

FIG. 4 shows the steps of photolithography and selective etching for manufacturing another solar cell of pin structure having an i-type semiconductor layer 3 of tandem structure.

Here, the above-mentioned steps shown in FIGS. 3(a) to 3(d) for forming the single layered i-type semiconductor layer are employed until the quantum dot layer 3a is provided, and then the cap layer 3b is formed.

On the cap layer 3b which serves as an intermediate layer 3d, a film 3a' for forming the second quantum dot layer 3a is grown by crystallization to have a thickness of 10 nm. Then, the steps shown in FIGS. 3(a) to 3(e) are repeated until the $2^{nd}$ to $n^{th}$ quantum dot layers 3a are formed.

In this case, the traces 21a' formed on the same quantum dot layer have the same size. The traces 21a' are formed to have different sizes on a number of quantum dot layers such that the projections 12 are formed in decreasing order of thickness from the first to the $n^{th}$ quantum dot layers 3a. That is, the projections 12 are formed such that the conditions that the thickness of the projections 12 on the first quantum dot layer 3a>the thickness of the projections 12 on the second quantum dot layer 3a>the thickness of the projections 12 on the third quantum dot layer 3a . . . are established.

After the $n^{th}$ quantum dot layer 3a is formed (FIG. 4(f)), a p-type (or n-type) layer 4 is formed to complete a pin solar cell 30 including the i-type semiconductor layer 3 of tandem structure (FIG. 4(g)).

Where the i-type semiconductor layer includes a single layered quantum dot layer 3a as described above, the projections 12 different in thickness are formed on the same quantum dot layer 3a. Further, in the case of the i-type semiconductor layer of tandem structure including the stacked quantum dot layers, the projections 12 are arranged on the quantum dot layers in decreasing order of thickness from the first quantum dot layer. Thus, in both cases, the practical forbidden band width in a broad range is achieved without changing the composition of the semiconductor material. Further, in the tandem structure, since the projections 12 are arranged on the quantum dot layers in increasing order of thickness from the light receiving face, the quantum dot layers 3a show the practical forbidden band widths in decreasing order from the light receiving face. Therefore, solar light is absorbed more efficiently.

Figure 5:
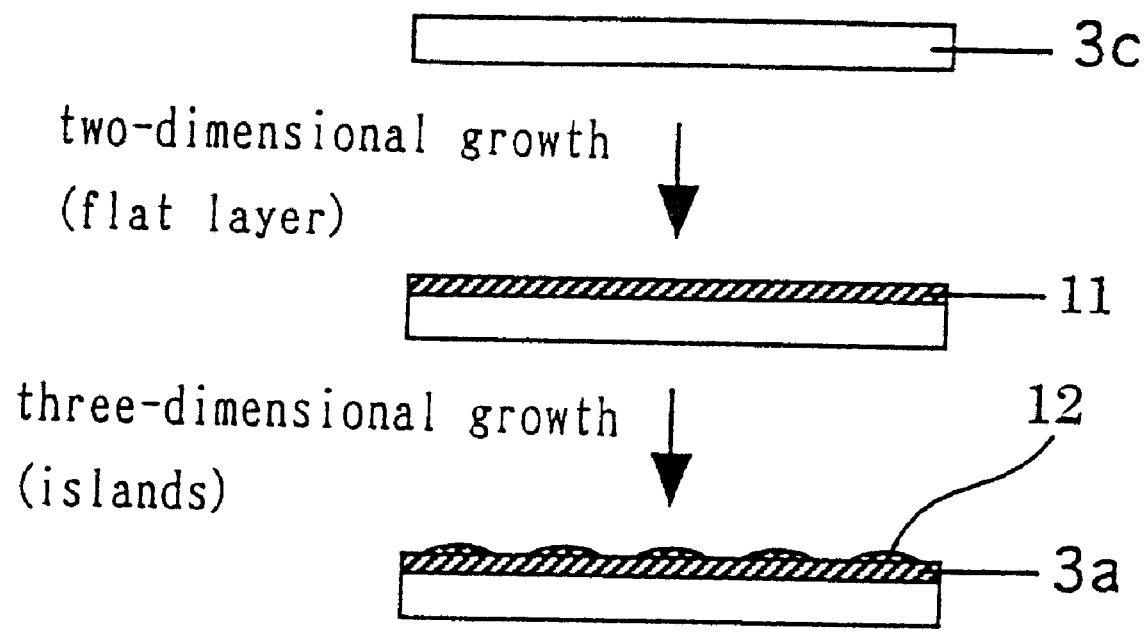
FIG. 5 is a view schematically illustrating how the crystal growth of the quantum dot layer progresses by the self-growing mechanism.

Referring to FIG. 5, the process utilizing the self-growing mechanism is described.

Where semiconductor materials having different lattice constants are deposited under the crystallization conditions as mentioned later, for example, the materials grow into a flat layer at an early stage (two-dimensional growth of the base portion 11). After the flat layer grows beyond a certain thickness, crystals grow in the island form spontaneously (three-dimensional growth of the projections 12). This is called the self-growing mechanism. The spontaneously formed projections 12 are naturally different in size (thickness). Making use of this property, the quantum dot layer 3a having the projections 12 different in thickness is easily provided.

The quantum dot layer 3a formed by the self-growing mechanism has the following features:

(1) The projections 12 are varied in size;
(2) A warp of the layer is alleviated when the three-dimensional growth of the projections 12 is finished and the layer is free from levels derived from lattice defects;
(3) Since the growth is carried out two-dimensionally and then three-dimensionally, the quantum wells derived from the flat layer which is grown two-dimensionally and the quantum wells derived from the quantum dots which are grown three-dimensionally are given to the quantum dot layer; and
(4) The steps of photolithography and selective etching are not required since the quantum dots are formed spontaneously.

According to the feature (1), since the quantum dots of different sizes are formed, gaps between the quantum levels are varied without changing the composition of the layer. Therefore, the wavelength range effective for the carrier excitation is not defined constant but varied in a broader extent. This allows providing a solar cell with improved spectral response characteristics and high photoelectric conversion efficiency.

Since carriers for generating an optical current are recombined and compensated by the defective levels, the feature (2) that the quantum dot layer 3a is free from the defective levels is advantageous because a shirt-circuit current of the solar cell increases.

According to the feature (3), the quantum dot layer 3a absorbs not only light corresponding to the gaps between the quantum levels depending on the thickness of the base portion 11, but also light in the wavelength range derived from the projections 12. Therefore, the wavelength range which contributes to the carrier excitation becomes much broader (see FIG. 2).

According to the feature (4), the crystal growth is carried out continuously in a crystal growth system. Therefore, need of a complicated manufacturing process is eliminated and possibility of impurity contamination is reduced. Impurity levels should be avoided because they promote the carrier recombination and cause reduction in characteristics of the solar cell.

By employing the self-growing mechanism with appropriately selected materials, the quantum dot layer 3a is formed in a simpler process than the above-described process utilizing photolithography and selective etching.

It is desired that the lattice constant of the material of the quantum dot layer 3a is 101.5% to 107.5% of the lattice constant of the material of the base layer 3c. When the lattice constant of the former is smaller than 101.5%, the crystal growth does not shift to the three-dimensional growth. Further, when the lattice constant of the former is greater than 107.5%, the three-dimensional growth begins at the early stage of the crystal growth. The thus formed quantum dot layer 3a includes numerous lattice defects due to lattice warpage.

Where GaAs is used as a semiconductor material for forming the n-type and p-type semiconductor layers, $In_xGa_{1-x}As$ (0.2<x<1) may be used as a material for the quantum dot layer 3a. Further, where multiple quantum dot layers 3a are stacked, GaAs may be used as a material for the intermediate layer 3d between the quantum dot layers 3a.

Figure 6:
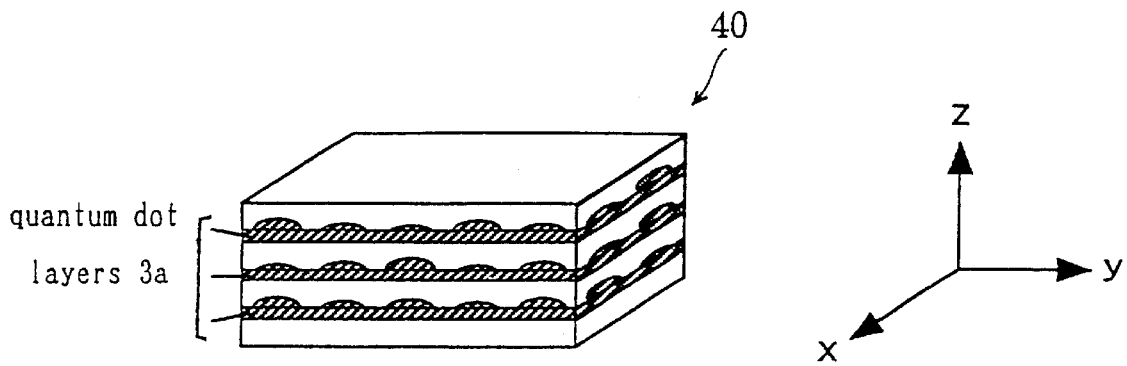
FIG. 6 is a view schematically illustrating a solar cell having the quantum dot layer formed by the self-growing mechanism.

FIG. 6 shows a structure of a solar cell 40 including three quantum dot layers 3a formed by the self-growing mechanism.

Figure 7:
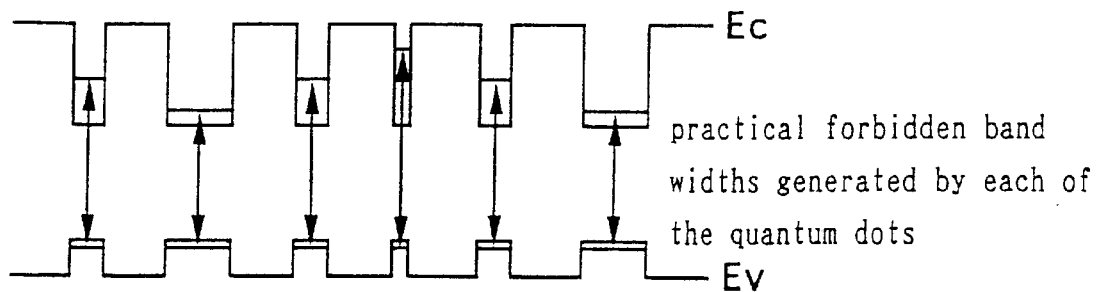
FIG. 7 is a view schematically illustrating the practical forbidden band widths generated by the single quantum dot layer.
Figure 8:
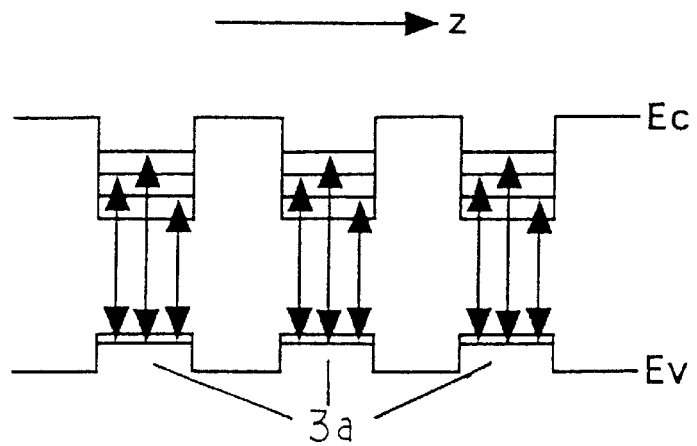
FIG. 8 is a view schematically illustrating the practical forbidden band widths generated by the quantum dot layers.

In the solar cell 40, the projections 12 are formed such that energy gaps between the quantum levels are different on the quantum dot layer 3a as shown in FIG. 7, and that energy gaps between the quantum levels are different among the three different quantum dot layers 3a as shown in FIG. 8. The multiple projections 12 of such various forms provide the broad wavelength range for light absorption.

In the manufacture of the quantum dot layer 3a by the self-growing mechanism, what is the most important is to know when the two-dimensional growth shifts to the three-dimensional growth. However, a point of time of the shift from the two-dimensional growth to the three-dimensional growth varies depending on the lattice constant of the material to be deposited, and thus considerable experience is required to know the point exactly.

According to the present invention, the progress of the deposition is observed by Reflection High Energy Electron Diffraction (hereinafter referred to as RHEED). Based on the observation result, the point where the material supply should be stopped is confirmed. Explanation of RHEED is described below.

Figure 9:
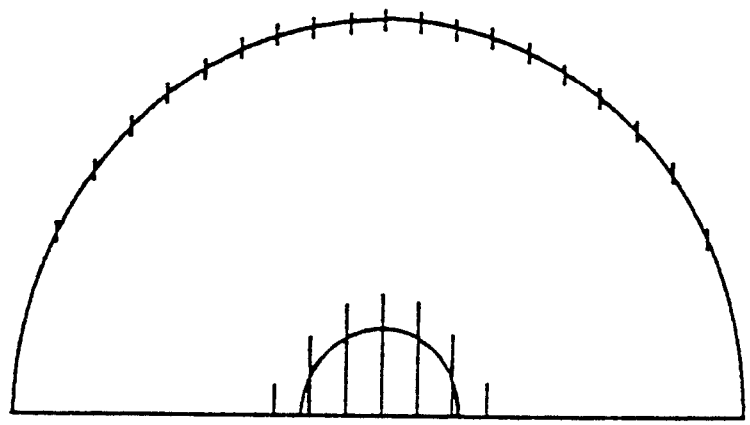
FIG. 9 is a view schematically illustrating a pattern obtained by reflection high energy electron diffraction.
Figure 10:
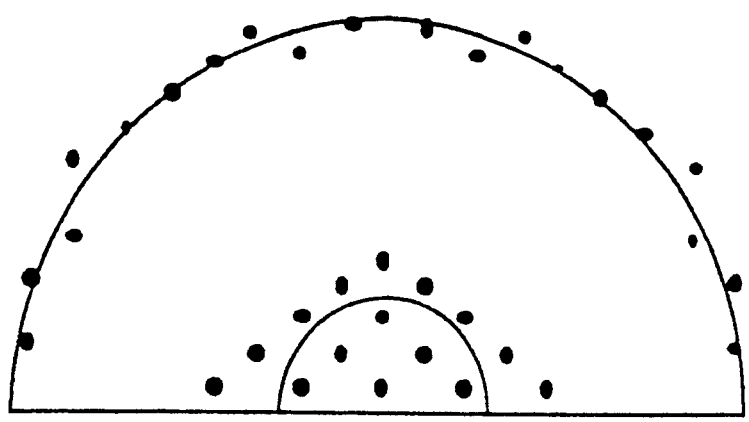
FIG. 10 is a view schematically illustrating another exemplary pattern obtained by reflection high energy electron diffraction.

RHEED is an observation method wherein electrons having an energy as high as 10–50 keV are incident on a sample with an inclination of a very small angle (about 1°) and an electron beam diffracted at the crystal lattice based on the undulation of the electrons is projected to a fluorescent screen, thereby observing the crystal surface morphology. Since the electrons are inclined at a small angle, they are introduced to several atomic layers from the surface. The diffraction from the surface is remarkable, which significantly reflects the surface structure. A linear pattern shown in the fluorescent screen signifies that the sample surface is flat (FIG. 9) and a dot pattern signifies that the sample surface is rough (FIG. 10).

Making use of this method, the material supply is stopped when the linear pattern turns to the dot pattern. Thus, the formation of the quantum dot layer 3a is easily controlled.

EXAMPLE 1

The solar cell according to the present invention may be formed by molecular beam epitaxy (MBE) or metal-organic chemical vapor deposition (MOCVD) which is advantageous in controlling the film thickness.

In this example the solar cell is formed by MBE using GaAs as a material for the p-type and n-type semiconductor layers and InGaAs as a material for the quantum dot layer. The quantum dot layer 3a is formed by the self-growing mechanism.

Figure 11:
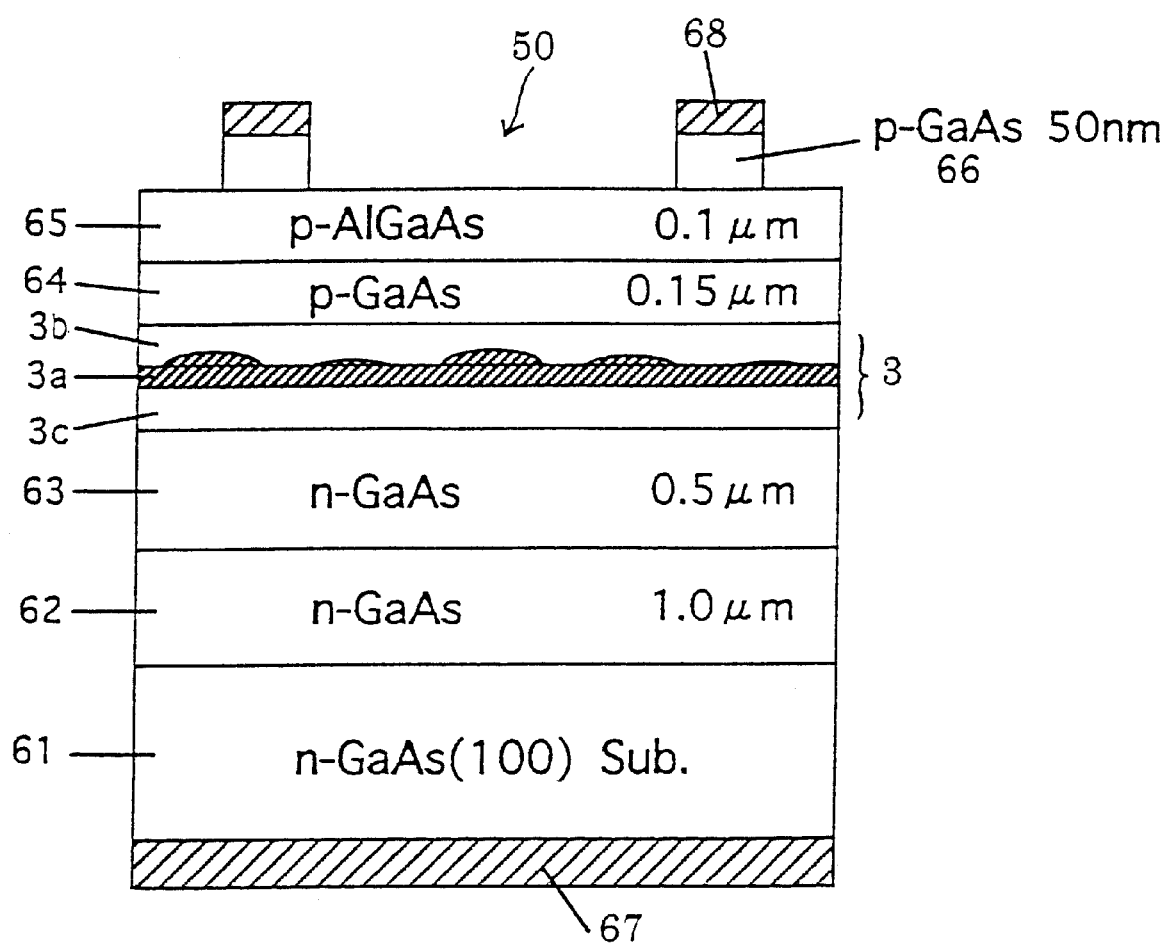
FIG. 11 is a sectional view illustrating a solar cell structure according to an example of the present invention.

FIG. 11 shows a sectional view of a solar cell 50 manufactured in Example 1.

The solar cell 50 is manufactured by the following process.

First, a semiconductor substrate 61 is placed in an MBE apparatus. On the semiconductor substrate 61 an n-GaAs layer 62 is formed to serve as a buffer layer for improving crystallinity of a light absorbing layer to be deposited thereon. On the n-GaAs layer 62 an n-GaAs layer 63 and a GaAs layer 3c which serves as a base layer are grown by crystallization. Then, a quantum dot layer 3a of InGaAs is formed by the self-growing mechanism.

The thus formed quantum dot layer 3a has a thickness of about four atomic layers (about 3 nm). After the crystal growth of the quantum dot layer 3a, a GaAs cap layer 3b of about 5 nm thick is grown to gain the flatness of the crystal surface, thereby an i-type semiconductor layer 3 is completed.

On the cap layer 3b a p-GaAs layer 64 is grown by crystallization to provide a nip structure. Then, a $p-Al_{0.8}Ga_{0.2}As$ layer 65 is formed as a window layer. Then, a p-GaAs contact layer 66 is formed by crystal growth.

The resulting substrate is taken out of the MBE apparatus. Then an n-type electrode 67 is formed on the back surface of the semiconductor substrate 61. On the contact layer 66 a comb-shaped electrode is formed by photolithography and lift-off method. With the comb-shaped electrode as a mask, the contact layer 66 is selectively etched to form a p-type electrode. Thus, the solar cell 50 of 1×1 cm is completed.

A Si-doped GaAs substrate (001) is used the semiconductor substrate 61. The substrate 61 is degreased with an organic solvent and treated with an etchant of sulfuric acid base before use, and then introduced to the MBE apparatus. Substrate temperature is controlled to 520° C. during the formation of the i-type semiconductor layer 3a including the quantum dot layer 3a in order to prevent re-elimination of In. Other layers are formed at 590° C. Composition ratio of In in the quantum dot layer 3a is 0.5. Si and Be are used as an n-type dopant and a p-type dopant, respectively. The n-type electrode 67 is made of Au—Ge and the p-type electrode 68 is made of Au—Zn, both of which are formed by resistance heating evaporation.

EXAMPLE 2

In this example the solar cell including stacked quantum dot layers 3a is formed. The solar cell is formed by MBE using GaAs as a material for the p-type and n-type semiconductor layers and InGaAs as a material for the quantum dot layers. The quantum dot layers 3a are formed by the self-growing mechanism.

Figure 12:
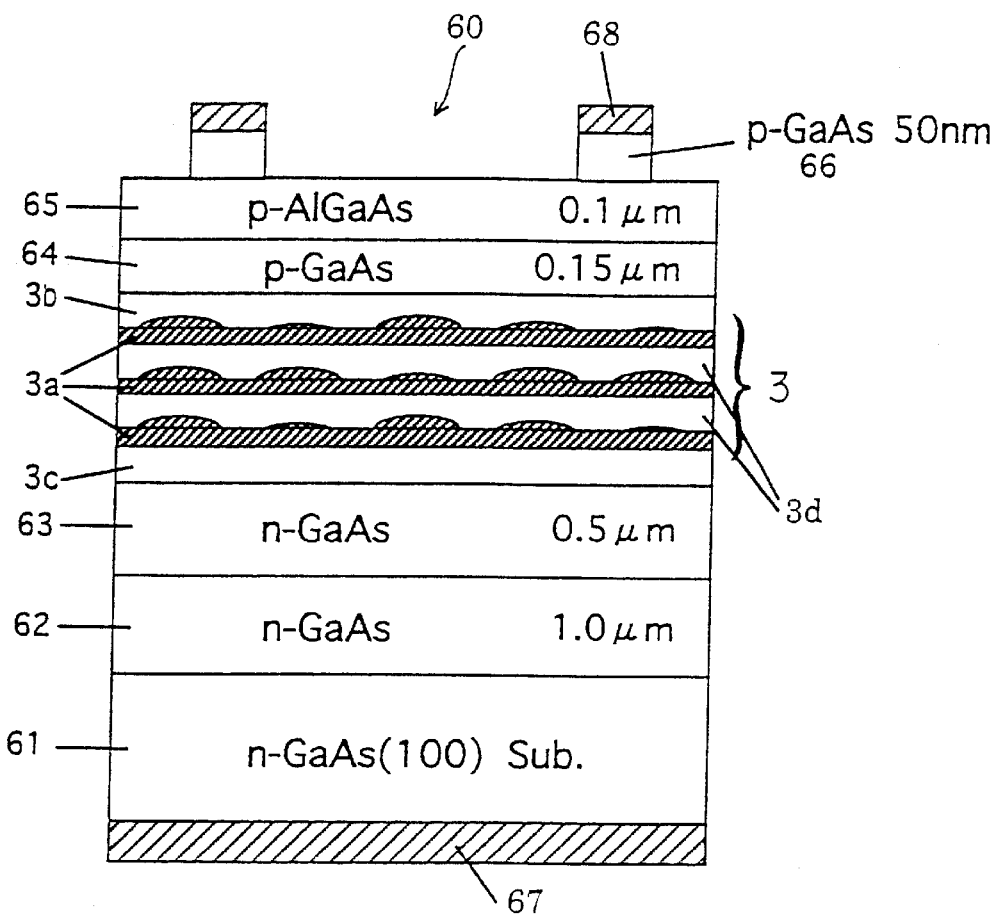
FIG. 12 is a sectional view illustrating a solar cell structure according to another example of the present invention.

FIG. 12 shows a sectional view of a solar cell 60 manufactured in Example 2.

The solar cell 60 includes an i-type semiconductor layer 3 in which three quantum dot layers 3a are stacked.

The i-type semiconductor layer 3a is formed in the same manner as in Example 1. That is, a GaAs layer 3c serves as a base layer is grown by crystallization, a first quantum dot layer 3a of InGaAs is formed and an intermediate layer 3d is grown through crystallization to gain the flatness of the crystal surface. Then, the film formation is repeated in the same manner as the above to form a second quantum dot layer 3a of InGaAs, another intermediate layer 3d, a third quantum dot layer 3a of InGaAs and a GaAs cap layer 3b. Thus, the i-type semiconductor layer is completed. The thickness, material, formation conditions of each layer are the same as in Example 1.

Figure 13:
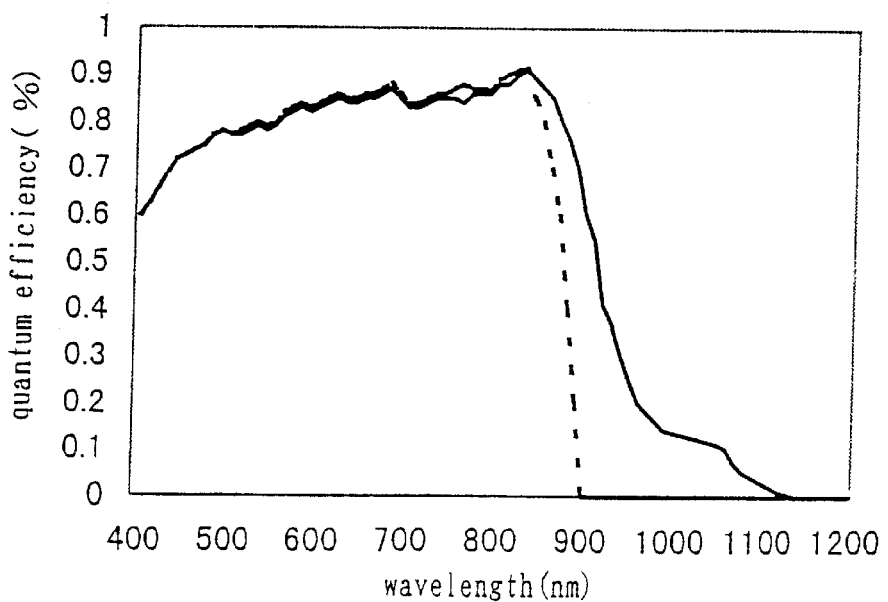
FIG. 13 is a graph illustrating a comparison of spectral response characteristics between the solar cell according to the present invention and a conventional solar cell.
Figure 14:
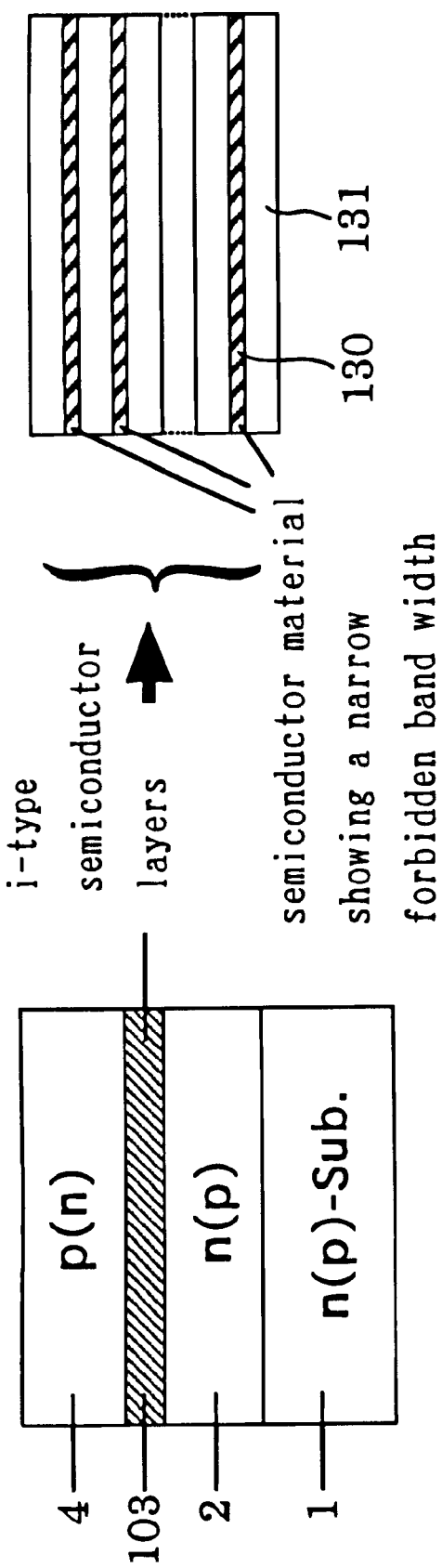
FIG. 14 is a sectional view illustrating an example of a conventional solar cell of multiple quantum well structure.
Figure 15:
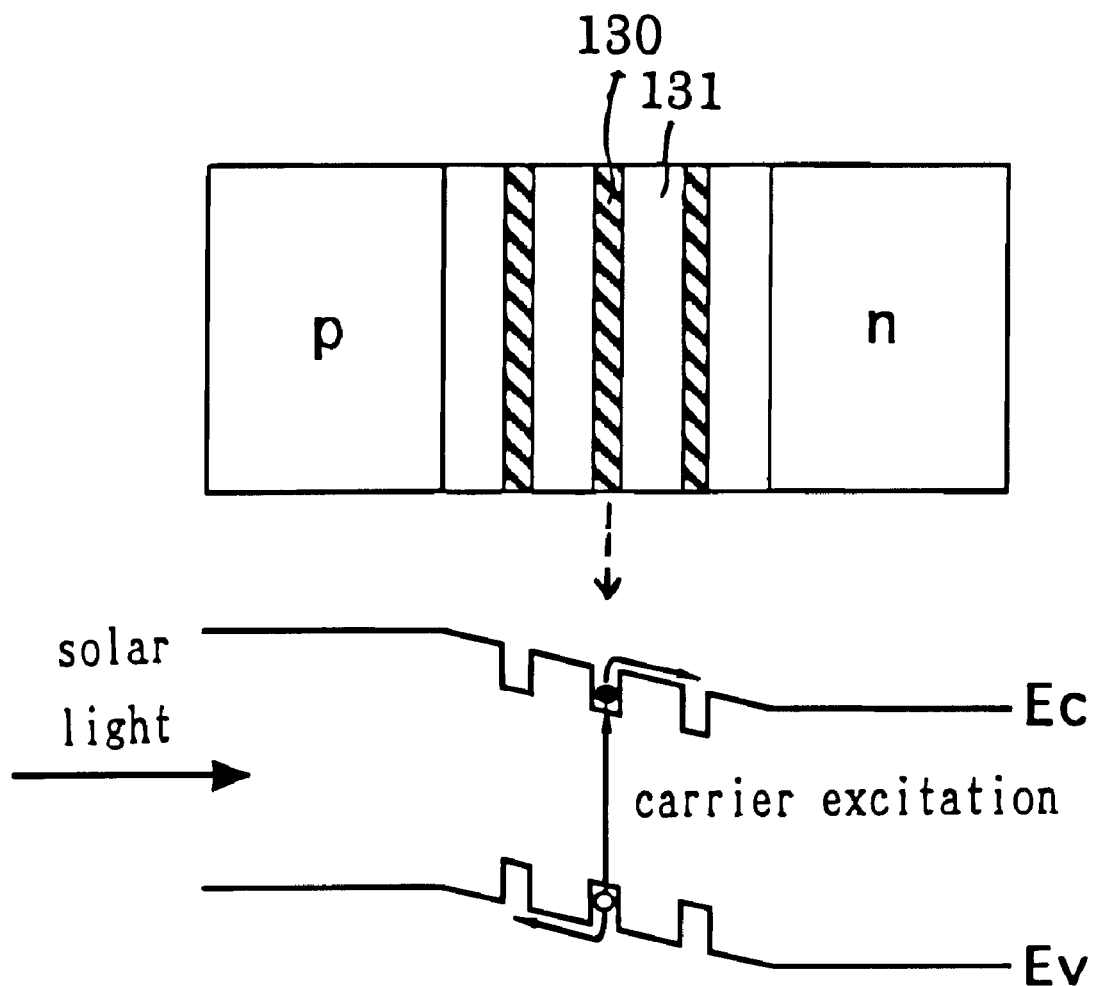
FIG. 15 is a view illustrating an energy band model of the conventional solar cell of FIG. 14.

FIG. 13 shows a comparison of spectral response characteristics between the solar cell 50 manufactured in Example 1 (FIG. 11) and a solar cell of conventional structure.

In FIG. 13, a solid line indicates the spectral response characteristics of the solar cell 50, whereas a broken line indicates those of a conventional solar cell of pn structure made of a single GaAs material lacking the i-type semiconductor layer 3. The p-type and n-type layers in the conventional solar cell have the same composition as those of the solar cell 50.

Since the i-type semiconductor layer 3 including the quantum dot layer 3a is provided, the solar cell 50 absorbs light having energy smaller than the forbidden band width of GaAs (1.42 eV), i.e., light of longer wavelength of 870 to 1130 nm as shown in FIG. 13, and convert the light to electric current.

In the above examples, the quantum dot layer 3a is inserted in the i-type semiconductor layer of the pin solar cell. However, it will be understood easily that the quantum dot layer 3a may be inserted in a pn junction of a solar cell pn structure.

According to the present invention, a quantum well layer (a quantum dot layer) which is made of a second compound semiconductor material and has a plurality of projections is inserted in a pn junction of a solar cell of pn structure or an i-type semiconductor layer of a solar cell of pin structure. Therefore, the present invention provides a solar cell capable of absorption and photoelectric conversion of not only light of wavelength corresponding to the forbidden band width of a semiconductor material forming the pn or pin junction but also light of wavelength corresponding to the practical forbidden band width generated by the quantum dot layer.

Further, according to the quantum dot layer, variation in size of the projections enlarges the practical forbidden band width, which allows utilization of light in broader wavelength without changing the composition ratio in the quantum dot layer.

Still according to the present invention, different bandgaps are generated without stacking multiple quantum well layers different in thickness as employed in the conventional solar cell.

Since the quantum dot layers are formed of the same material, the manufacturing steps are simplified.

Further, since the quantum dot layer having the practical forbidden band width is formed in the pn or pin junction, carriers are easily gathered.

Still according to the present invention, a severe and complicated manufacture process is not required. Accordingly, a process of manufacturing the solar cell having high photoelectric conversion efficiency which compensates the manufacture facilities and steps is provided. Thus, the present invention provides a solar cell having high photoelectric conversion efficiency and a simplified process of manufacturing the same.

What is claimed is:

1. A solar cell comprising:
   a p-type semiconductor layer and an n-type semiconductor layer comprising a first compound semiconductor material,
   a semiconductor layer sandwiched between the p-type semiconductor layer and the n-type semiconductor layer, the semiconductor layer including one or more quantum well layers which comprise a second compound semiconductor material which is different than the first compound semiconductor material, and
   wherein a plurality of different sized projections are formed on surface(s) of the one or more quantum well layers.

2. A solar cell according to claim 1, wherein the semiconductor layer comprises a pair of i-type semiconductor layers comprising the first compound semiconductor material sandwiching one of the one or more quantum well layers.

3. A solar cell according to claim 1, wherein a plurality of the quantum well layers are provided, and wherein the semiconductor layer comprises at least three stacked i-type semiconductor layers comprised of the first compound semiconductor material and respective ones of the quantum well layers are inserted between the i-type semiconductor layers.

4. A solar cell according to claim 3, wherein the projections of the quantum well layers between the three stacked i-type semiconductor layers are arranged in increasing order of size from the quantum well layer closer to the p-type or n-type semiconductor layer which serves as a light receiving surface to the quantum well layer farther from the light receiving surface.

5. A solar cell according to claim 1, wherein a lattice constant of the first compound semiconductor material is 101.5 to 107.5% of a lattice constant of the second compound semiconductor material.

6. A solar cell according to claim 1, wherein the first compound semiconductor material is GaAs and the second compound semiconductor material is InGaAs.

7. A solar cell according to claim 6, wherein InGaAs is $In_xGa_{1-x}As$ wherein $0.2<x<1$.

8. A process of manufacturing a solar cell comprising:
   (a) forming a semiconductor base layer on a p-type or n-type semiconductor layer comprised of a first compound semiconductor material;
   (b) forming a quantum well layer comprised of a second compound semiconductor material over the semiconductor base layer, the quantum well layer including a plurality of different sized projections, thereby providing a plurality of projections of at least two different sizes on the semiconductor base layer;
   (c) forming a semiconductor cap layer comprised of the first compound semiconductor material on the quantum well layer; and
   (d) forming an n-type or p-type semiconductor layer comprised of the first compound material semiconductor on the semiconductor cap layer.

9. A process according to claim 8, wherein, on the quantum well layer formed on the semiconductor base layer in the step (b), the formation of a semiconductor intermediate layer and another quantum well layer in this order is carried out at least once, and then the step (c) of forming the semiconductor cap layer is carried out.

10. A process according to claim 8, wherein the quantum well layer is formed by providing a base portion of the second compound semiconductor material by lithography and providing a plurality of projections of different sizes on the base portion by selective etching.

11. A process according to claim 8, wherein the quantum well layer is formed by providing a base portion of the second compound semiconductor material by lithography and providing a plurality of projections spontaneously via crystal growth on the base portion by making use of a self-growing mechanism of the second compound semiconductor material.

12. A process according to claim 9, wherein the semiconductor base layer, the semiconductor cap layer or the semiconductor intermediate layer is an i-type semiconductor layer of the first compound semiconductor material.

13. A process according to claim 8, wherein a lattice constant of the first compound semiconductor material is 101.5 to 107.5% of a lattice constant of the second compound semiconductor material.

14. A process according to claim 8, wherein the first compound semiconductor material is GaAs and the second compound semiconductor material is InGaAs.

15. A process according to claim 14, wherein InGaAs is $In_xGa_{1-x}As$ wherein $0.2<x<1$.

16. A process according to claim 8, wherein the quantum well layer is formed by molecular beam epitaxy in which a source of the second compound semiconductor material is evaporated under vacuum and the source is supplied on an underlying layer to deposit the source into a thin film crystal, while controlling the source supply by observing a reflection high energy electron diffraction pattern.

17. A process according to claim 8, wherein the second compound semiconductor is made of a group III element and a group V element shown in the periodic table and the lattice constant or the forbidden band width of a source of material to be supplied is varied by changing the compound crystal ratio of the group III element and the group V element.

18. A solar cell comprising:

a p-type semiconductor layer and an n-type semiconductor layer comprising a first compound semiconductor material;

a semiconductor layer provided between at least the p-type semiconductor layer and the n-type semiconductor layer, wherein the semiconductor layer includes a quantum well layer comprising a second compound semiconductor material and having a plurality of different sized projections defined at a major surface thereof.

19. The solar cell of claim 18, wherein a plurality of the projections defined on the major surface of the quantum well layer have respective different thicknesses.

20. The solar cell of claim 18, wherein the semiconductor layer comprises only a single quantum well layer which is said quantum well layer with the different sized projections.

21. The solar cell of claim 18, wherein a lattice constant of the first compound semiconductor material is 101.5 to 107.5% of a lattice constant of the second compound semiconductor material.

* * * * *